United States Patent
Janssens et al.

(10) Patent No.: US 11,289,570 B2
(45) Date of Patent: Mar. 29, 2022

(54) SEMICONDUCTOR DEVICE HAVING OPTIMIZED DRAIN TERMINATION AND METHOD THEREFOR

(71) Applicant: SEMICONDUCTOR COMPONENTS INDUSTRIES, LLC, Phoenix, AZ (US)

(72) Inventors: Johan Camiel Julia Janssens, Asse (BE); Jaroslav Pjencak, Dolni Becva (CZ); Moshe Agam, Portland, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/111,931

(22) Filed: Aug. 24, 2018

(65) Prior Publication Data
US 2020/0066838 A1 Feb. 27, 2020

(51) Int. Cl.
*H01L 29/76* (2006.01)
*H01L 29/94* (2006.01)
(Continued)

(52) U.S. Cl.
CPC ........ *H01L 29/0638* (2013.01); *H01L 21/761* (2013.01); *H01L 21/76224* (2013.01);
(Continued)

(58) Field of Classification Search
CPC ............. H01L 21/761; H01L 21/76224; H01L 29/0649; H01L 29/7824; H01L 29/7817;
(Continued)

(56) References Cited

U.S. PATENT DOCUMENTS 6,168,996 B1 * 1/2001 Numazawa ....... H01L 21/28185
438/270
8,921,916 B2 * 12/2014 Huang ................ H01L 29/7883
257/318
(Continued)

OTHER PUBLICATIONS

Long Zhang, Jing Zhu, Minna Zhao, Desheng Ding, Jian Chen, Weifeng Sun, Fast recovery SOI PiN diode with multiple trenches, Superlattices and Microstructures, Nov. 2017, pp. 405-413, vol. 111, Elsevier Ltd., www.elsevier.com/locate/superlattices.
(Continued)

*Primary Examiner* — Kimberly N Rizkallah
*Assistant Examiner* — Dilinh P Nguyen
(74) *Attorney, Agent, or Firm* — Chamberlain Hrdlicka

(57) ABSTRACT

Systems and methods of the disclosed embodiments include a semiconductor device having a semiconductor substrate. The semiconductor substrate has a first major surface, an opposing second major surface, a first doped region of a first conductivity type disposed beneath the first major surface, and a semiconductor region of the first conductivity type disposed between the first doped region and the second major surface. The semiconductor device may also include a trench isolation structure, comprising a conductive trench filling enclosed by an insulating trench liner. The trench isolation structure extends from the first major surface through the first doped region and into the semiconductor region. The semiconductor device may also include a semiconductor device structure disposed with a drain structure, and a connection structure formed between the conductive trench filling of the trench isolation structure and the drain region.

16 Claims, 4 Drawing Sheets

(51) Int. Cl.
*H01L 31/062* (2012.01)
*H01L 23/48* (2006.01)
*H01L 29/06* (2006.01)
*H01L 29/78* (2006.01)
*H01L 21/761* (2006.01)
*H01L 21/762* (2006.01)
*H01L 29/739* (2006.01)
*H01L 27/092* (2006.01)

(52) U.S. Cl.
CPC ...... *H01L 29/0649* (2013.01); *H01L 29/7824* (2013.01); *H01L 27/092* (2013.01); *H01L 29/7393* (2013.01)

(58) Field of Classification Search
CPC ............. H01L 27/098; H01L 29/66893; H01L 29/7392; H01L 21/8228; H01L 27/082
USPC ................................................ 257/337, 774
See application file for complete search history.

(56) References Cited

U.S. PATENT DOCUMENTS

| | | |
|---|---|---|
| 9,748,330 B2 | 8/2017 | Janssens |
| 10,026,728 B1 | 7/2018 | Agam et al. |
| 2006/0267044 A1 | 11/2006 | Yang |
| 2008/0217690 A1* | 9/2008 | Mandelman ........ H01L 27/1207 257/351 |
| 2010/0006931 A1 | 1/2010 | Denison |
| 2011/0014766 A1 | 1/2011 | Hebert |
| 2011/0127602 A1 | 6/2011 | Mallikarjunaswamy |
| 2013/0178043 A1* | 7/2013 | Cheng .................... H01L 21/84 438/400 |
| 2016/0064547 A1* | 3/2016 | Siemieniec ......... H01L 29/7811 257/329 |
| 2017/0062610 A1 | 3/2017 | Agam et al. |
| 2019/0237576 A1* | 8/2019 | Qiao ................... H01L 29/0852 |

OTHER PUBLICATIONS

Park et al., "A proposal of LDMOS using Deep Trench poly Field Plate", IEEE Proceedings of the 27th International Symposium on Power Semiconductor Devices & IC's, May 10-14, 2015; pp. 149-152. (Paper).

* cited by examiner

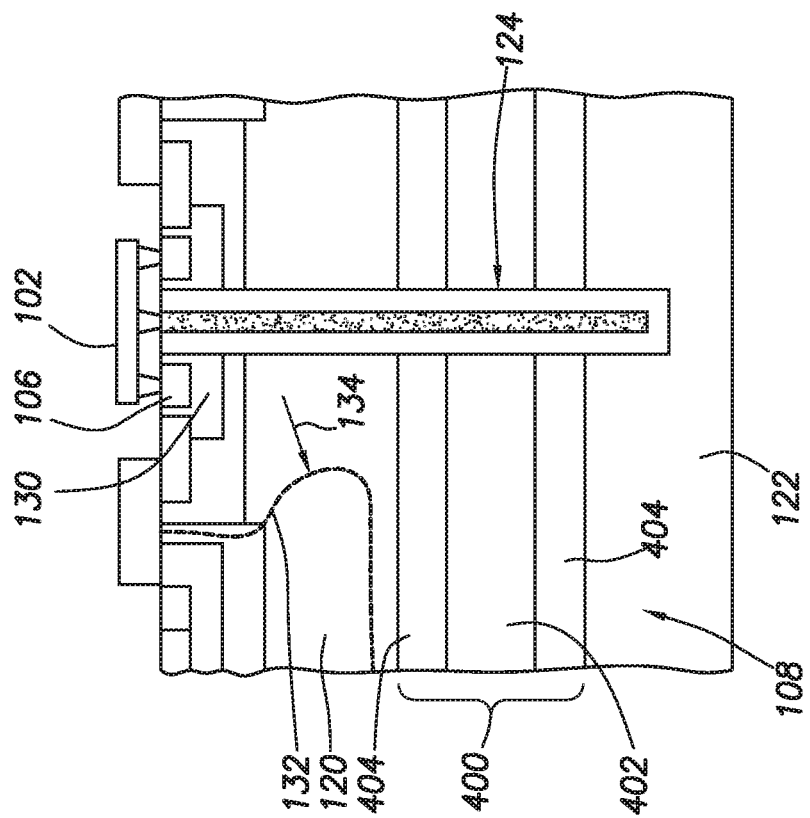
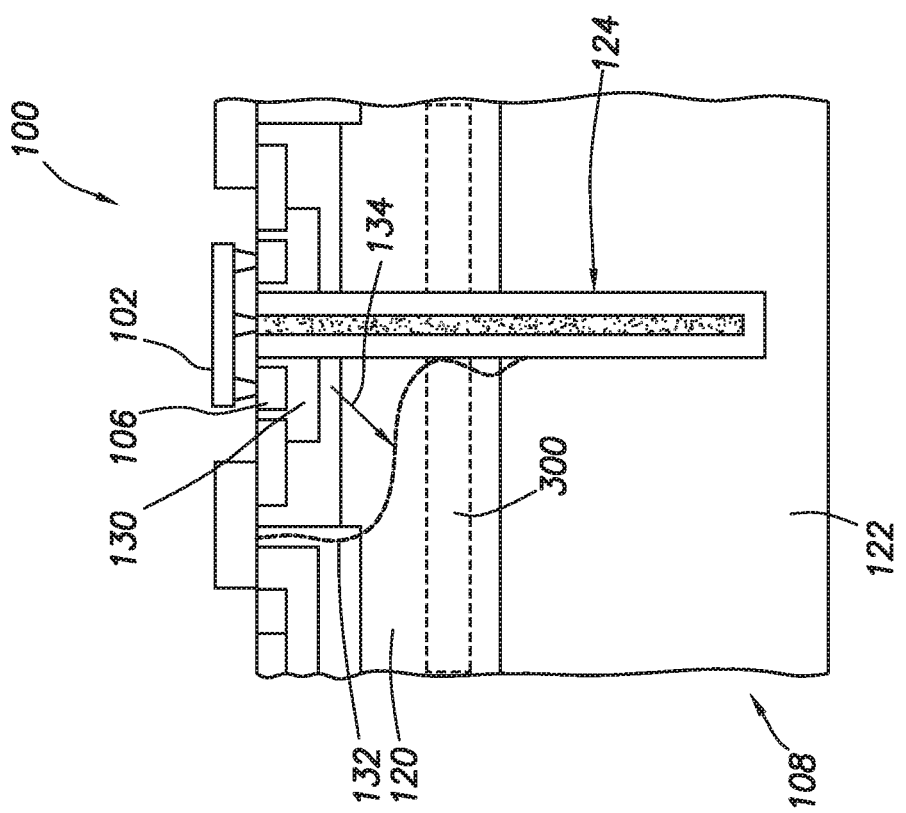

000
SEMICONDUCTOR DEVICE HAVING OPTIMIZED DRAIN TERMINATION AND METHOD THEREFOR

CROSS-REFERENCE TO RELATED APPLICATIONS

Not Applicable.

BACKGROUND

The present invention relates, in general, to electronics and, more particularly, to semiconductor devices and methods of forming semiconductor devices.

Integrated circuits have been classified as analog devices, digital devices, or power devices. Smart Power technologies combine or integrate analog and digital circuits with power devices on or within a single semiconductor substrate. The smart part of the smart power circuit adds, for example, control, diagnostic, and protection functions to the power semiconductor devices. Smart Power technologies have increased the robustness and reliability of power drivers for automotive and industrial applications. Such applications have included, for example, intelligent power switches for controlling an ABS-braking system, system power chips for airbag control, engine management, motor control, switched mode power supplies, intelligent switching of lights, among others.

The integration of logic and analog functions with power transistors on a single semiconductor die presents challenges in maximizing the voltage breakdown ("VBD") for each different functional device. In a given multipurpose Bipolar-CMOS-DMOS ("BCD") technology, the family of available doping layers is set by the design of the main device. For example, doping levels may be designed to optimize $R_{ON}$ and key properties of the main devices, very often settling with a suboptimal VBD due to the other requirements of the design.

High-voltage applications of BCD technology (in particular automotive) occasionally require devices with a higher VBD than had originally been foreseen (e.g. for levelshifting to floating domains, switching external HV signals, protecting the IC against overstress etc.). Increasing the VBD, however, typically involves adding cost or process steps to the process.

Accordingly, it is desirable to have a device architecture that further lowers the $R_{ON}$ for a given VBD, or raises the VBD for a given $R_{ON}$, without adding cost to the process. Furthermore, the design of device architecture should preferably be portable across many flavors of the core process, including, for example, an SOI version, a non-isolated 'traditional substrate' version, and a floating n-type doped buried layer ("NBL") process.

BRIEF DESCRIPTION OF THE DRAWINGS

FIG. 3 illustrates an enlarged partial cross-sectional view of one embodiment of a semiconductor device having a connection between conductive material inside a trench isolation structure and a semiconductor device structure, with an anti-punch through layer for limiting a depletion region;

FIG. 4 illustrates an enlarged partial cross-sectional view of one embodiment of a semiconductor device having a connection between conductive material inside a trench isolation structure and a semiconductor device structure, with a floating n-type-doped buried layer ("NBL");

Figure 2:
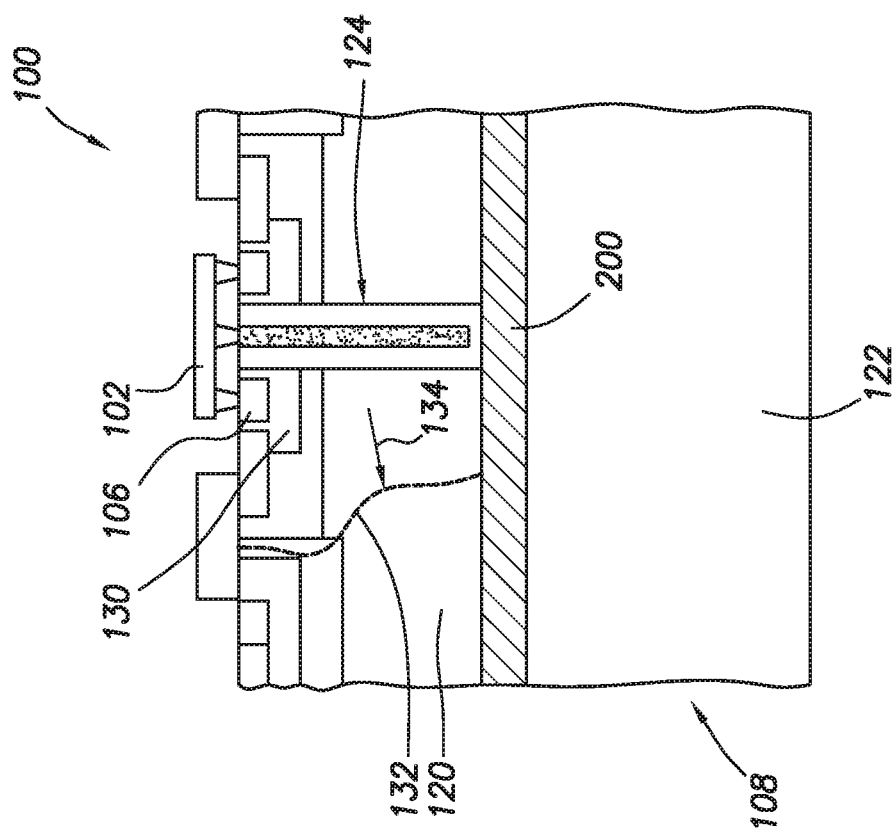
FIG. 2 illustrates an enlarged partial cross-sectional view of one embodiment of a semiconductor device having a connection between conductive material inside a trench isolation structure and a semiconductor device structure, and an oxide layer below a doped layer.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

One solution proposed for solving the above described issues with related devices uses a connection structure to form a direct ohmic coupling between a drain region of a semiconductor device region and the conductive filling material inside a trench isolation structure within a semiconductor substrate. In this approach, the connection may be provided via metal interconnect and contacts/vias available in the process, or, using the same material that forms the conductive filling of the trench isolation structure. This approach beneficially improves, among other things, the breakdown voltage of the junction in the drain region by increasing the beneficial aspects (e.g., size and shape) of the depletion region. The conductive material in the trench was found in practice to be forming a vertical field plate, making the field in the depletion region more one-dimensional. That is, the curvature of the field lines inside the area within the doped region that is depleted is reduced.

The present description includes, among other features, a semiconductor device structure comprising a device architecture that is portable across many flavors of the core process, including, for example, an SOI version, a non-isolated 'traditional substrate' version, and a floating negatively-doped buried layer ("NBL") process. The device architecture may be implemented by using the same material for the connection that is used to make the trench isolation structure. The connection may be formed when at the time that the trench isolation structure is filled with poly-silicon, and is subsequently etched away. That is, the area between the trench isolation structure and the drain region drain that is normally etched away is instead left in place as the connection. In most cases however, the connection will be made by regular metal interconnect available in the process.

In an embodiment of the present description a semiconductor device includes a semiconductor substrate having a first major surface, an opposing second major surface, a first doped region of a first conductivity type disposed beneath the first major surface, and a semiconductor region of the first conductivity type disposed between the first doped region and the second major surface. The semiconductor device may include a trench isolation structure having a conductive trench filling enclosed by an insulating trench liner. The conductive trench filling may extend from the first major surface through the first doped region and extending into the semiconductor region. The structure may also include a semiconductor device disposed with the first doped region. The semiconductor device may comprise a drain region having a drain structure, and a connection structure formed between the conductive trench filling of the trench isolation structure and the drain region.

In a further embodiment, a method of forming a semiconductor device comprises providing a semiconductor substrate having first and second opposing major surfaces, wherein the semiconductor substrate has a first doped region of a first conductivity type disposed beneath the first major surface, and a semiconductor region of the first conductivity type disposed between the first doped region and the second major surface. The method also includes providing a trench isolation structure having a conductive trench filling enclosed by an insulating trench liner extending from the first major surface through the first doped region and into the semiconductor region. The trench isolation structure may define a perimeter for an active region comprising a drain region of a conductivity type that is different than the conductivity type of the first doped region. The method may also include providing a connection structure between the conductive trench filling of the trench isolation structure and the drain region.

Figure 1:
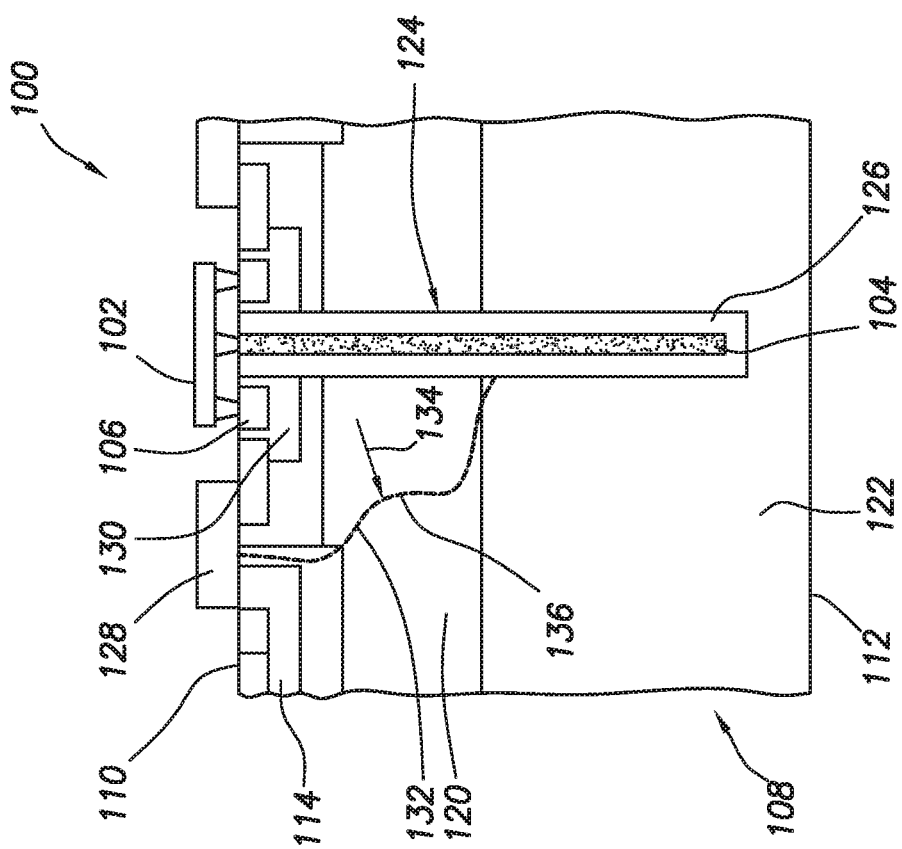
FIG. 1 illustrates an enlarged partial cross-sectional view of one embodiment of a semiconductor device having a connection between conductive material inside a trench isolation structure and a semiconductor device structure.

Turning now to the drawings, FIG. 1 illustrates an enlarged partial cross-sectional view of one embodiment of a semiconductor device 100, a device 100, or an electronic device 100 having a having a connection 102 between the conductive trench filling material 104 inside a deep trench isolation structure 124 and a semiconductor device structure, which may include for example a drain region 130 comprising a drain structure 106. The semiconductor device 100 is formed on a semiconductor substrate 108 that has a first major surface 110 and a second major surface 112. The first major surface 110 may include a functional device 114 that includes elements such as source, drain, gate, or other transistor components for generating and terminating a signal through the semiconductor device 100. Functional devices 114 can include, for example, power metal-oxide semiconductor ("MOS") devices, such as LDMOS devices, diode devices, complementary MOS ("CMOS") and/or bipolar logic devices, CMOS and/or bipolar analog devices, sensor devices, bipolar power transistor devices, insulated gate bipolar transistor ("IGBT") power devices, thyristors power devices, other power devices, and other similar semiconductor devices as known to those skilled in the art.

It is understood that multiple functional devices 114, may be instantiated inside doped region 120 within the confines of a given pocket delineated by trench isolation structures and insulated trench structures described later. Stated another way, a given pocket may include multiple functional devices 114, as is common practice in smart power technologies. Also, it is understood that functional devices 114 have been illustrated in simplified form so as to not distract from the present disclosure. Those skilled in the art understand that functional device 114 can include additional doped regions, isolation regions, and contact regions or structures.

The semiconductor substrate 108 includes a semiconductor region 122 that may be adjacent to the second major surface 112. In one embodiment, semiconductor region 122 is a silicon region or wafer doped with boron, and has a dopant concentration in a range from about $4.0 \times 10^{18}$ atoms/cm$^3$ to about $1.0 \times 10^{19}$ atoms/cm$^3$ or more. It is understood that semiconductor region 122 can comprise a plurality of p-type layers of different dopant concentration. Additionally, it is understood that semiconductor region 122 can include other types of materials including, but not limited to, heterojunction semiconductor materials. In accordance with the present embodiment, semiconductor region 122 is configured to be connected to a potential or configured to be a floating region (i.e., no ohmic or low-ohmic external voltage is imposed on semiconductor region 122).

Semiconductor substrate 108 further includes a doped region 120, doped layer 120, or doped pockets 120. In one embodiment, the doped region 120 can be a p-type conductivity region or layer and can be formed using epitaxial growth techniques, ion implantation and diffusion techniques, or other methods as known to those skilled in the art. In some embodiments, doped region 120 has a dopant concentration in a range from about $1.0 \times 10^{15}$ atoms/cm$^3$ to about $1.0 \times 10^{16}$ atoms/cm$^3$. In one embodiment, doped region 120 has a dopant concentration of about $3.0 \times 10^{15}$ atoms/cm$^3$. It is understood that the dopant concentration of doped region 120 as well as its thickness is adjusted in accordance with the desired characteristics of the functional devices 114 formed within semiconductor substrate 108. In another embodiment, doped region 120 can have a graded dopant profile. In a further embodiment, doped region 120 comprises a plurality of p-type layers of different dopant concentration. In a still further embodiment, doped region 120 has a substantially uniform dopant concentration in a direction substantially perpendicular to the first major surface 110.

Active regions of the semiconductor device 100 are segmented by a deep trench isolation ("DTI") structure 124 extending from the first major surface 110 downward or substantially vertically into the semiconductor region 122 of semiconductor substrate 108. In accordance with the present embodiment, DTI structure 124 is configured to laterally isolate, both physically and electrically, adjacent device active regions or pockets within semiconductor substrate 108 where functional devices 114 are provided. Stated another way, DTI structures 124 are configured to laterally isolate, both physically and electrically, a doped region 120 of a given pocket from any adjacent doped region 120 belonging to one or more adjacent pockets. The DTI structures 124 contain the conductive inner trench filling structure 104 and an insulating trench liner structure 126 around the conductive inner trench filling structure 104. A gate poly 128 switches the functional devices 114 on or off.

In certain embodiments (illustrated in FIG. 2), the DTI structures 124 do not extend into the semiconductor region 122. Instead, an insulating layer 200 is provided between the doped region 120 and the semiconductor region 122. The insulating layer 200 is required by certain embodiments of the circuit architecture, and the connection 102 will still function to increase the effectiveness of the semiconductor device 100. In one embodiment, insulating layer 200 can be a silicon on insulator (SOI) such as silicon-oxide material formed using thermal oxidation processes, low-temperature deposition processes, or other techniques as known to those skilled in the art. In another embodiment, insulating layer 200 can be the result of bonding two oxidized wafers together. In certain embodiments, the insulating layer 200 may be formed of a material with insulating properties that is not oxide/silicon-oxide.

Additionally or alternatively, the doped region 120 may include an anti-punch through ("APT") layer 300 with a dopant concentration substantially above the background concentration of doped region 120, as illustrated in FIG. 3. The APT layer 300, in certain embodiments, may be a layer having a conductivity type (i.e., n-type or p-type) that is the same as the doped region 120. The APT layer 300 may be required by the circuit architecture, and the connection 102 will still function to increase the effectiveness of the semiconductor device 100. In one embodiment, the APT layer 300 can be a p-type conductivity region or layer and can be formed using epitaxial growth techniques, ion implantation and diffusion techniques, or other methods as known to those skilled in the art. In some embodiments, doped region 300 has a dopant concentration in a range from about $1.0 \times 10^{16}$ atoms/cm$^3$ to about $1.0 \times 10^{18}$ atoms/cm$^3$. In one embodiment, doped region 300 has a dopant concentration of about $7.0 \times 10^{16}$ atoms/cm$^3$. It is understood that the dopant concentration of doped region 300 as well as its thickness is adjusted in accordance with the desired characteristics of the functional devices 114 formed within semiconductor substrate 108.

When the functional device 114 is engaged (for example by applying a voltage to drain structure 106), a drain region 130 is charged creating a depletion region 132 at the junction between the drain region 130 and the first doped region 120. The depletion region 132 allows a signal of a given voltage to be sustained between the first doped region 120 and the drain region 130. The drain region 130 has a conductivity type that is different than the first doped region 120. The first doped region 120 and the drain region 130 may each, in certain embodiments, be n-type or p-type. The size and shape of the depletion region 132 determines how high of a voltage the junction between drain region 130 and the first doped region 120 will support. The limit of this voltage is known as the voltage breakdown ("VBD"), beyond which the signal will leak to other components of the semiconductor substrate 108 with unintended consequences. In the illustrated embodiment of FIG. 1, the depletion region 132 is enhanced (in an enlarging direction 134) by a voltage applied to the conductive trench filling structure 104 through the connection 102. Stated another way, the conductive trench filling structure 104 carries a similar voltage to the semiconductor device structure due to the electrical (i.e., ohmic) coupling provided by the connection 102. This similar voltage assists the drain region 130 in further depleting the doped region 120, which enhances the depletion region 132. The connection 102 therefore enhances the depletion region 132 not only in size, but also in shape. Specifically, the depletion region 132 may include a corner 136 that is pushed in the enhancement direction 134 when the connection 102 is coupled and properly biased. In certain embodiments without the connection 102, the corner 136 is closer to the DTI structure 124, which causes the VBD to decrease.

The depletion region 132 may be confined or otherwise effected by the architecture of the semiconductor device 100. For example, the APT layer 300 may confine the depletion region 132 so that less of the doped region 120 is utilized as the depletion region 132. In certain embodiments as shown in FIG. 4, the semiconductor substrate 108 may further include a floating buried or sub-surface doped region 400, floating buried doped layer 400, or separation layer 400 disposed between semiconductor region 122 and doped region 120. In one embodiment, floating buried doped region 400 is configured to include an n-type layer 402 or buried doped region 402 and an n-type buried epitaxial layer 404 or buried epitaxial region 404.

In the present embodiment, floating buried doped region 400 is an electrically floating region, which means that no ohmic or low-ohmic external voltage is imposed on floating buried doped region 400. More particularly, semiconductor substrate 108 and device 100 are configured without any conductive or doped semiconductor structures providing an ohmic or highly doped contact or direct electrical pathway to buried layer 400. Stated another way, doped region 120 and semiconductor region 122 are formed or provided absent any diffused contact structures or conductive contact structures making direct or low-ohmic contact to floating buried doped region 400. Stated a different way, doped region 120 and semiconductor region 122 are configured so that no low-ohmic external voltage is imposed on floating buried doped region 400. In the present embodiment, the potential of the floating buried doped layer 400 becomes dynamically coupled to drain 106 via an inversion layer that forms itself alongside the deep trench isolation structure inside region 120 when the voltage on the conductive trench filling material 104 (which is coupled to the drain 106) is large enough to start inverting region 120. In other words, the conductive trench filling material starts acting as gate electrode of a vertical FET, which creates a conductive channel at the interface between the first doped region 120 and the deep trench isolation structure 124. The insulating trench liner structure 126 acts as dielectric for the vertical FET. In a preferred embodiment, floating buried doped region 400 extends laterally all the way or entirely across semiconductor region 122 between adjacent trench isolation structures 124. Stated another way, floating buried doped region 400 completely vertically separates doped region 120 from semiconductor region 122 with no portion of doped region 120 directly contacting semiconductor region 122 between trench isolation structures 124. In the illustrated embodiment of FIG. 4, the depletion region 132 is further enhanced (in an enlarging direction 134) by contributing an additional area to the depletion region 132 along the interface between floating buried doped region 400 and the doped region 120. Stated in other words, the presence of the floating buried doped region 400 assists the drain region 130 in further depleting the doped region 120, which enhances the depletion region 132. The floating buried doped region 400 therefore enhances the depletion region 132 not only in size, but also in shape. Specifically, the depletion region 132 may include a corner 136 that is pushed in the enhancement direction 134 when floating buried doped region 400 is present.

Figure 6:
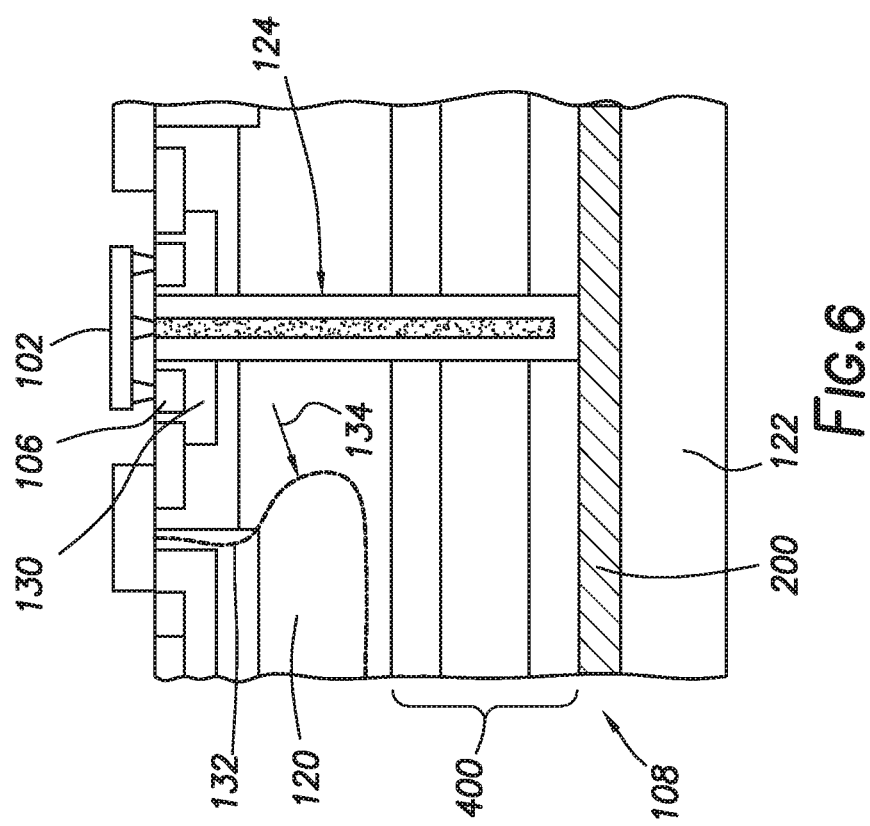
FIG. 6 illustrates an enlarged partial cross-sectional view of one embodiment of a semiconductor device having a connection between conductive material inside a trench isolation structure and a semiconductor device structure, with a floating buried layer and an oxide layer below the floating buried layer.
Figure 5:
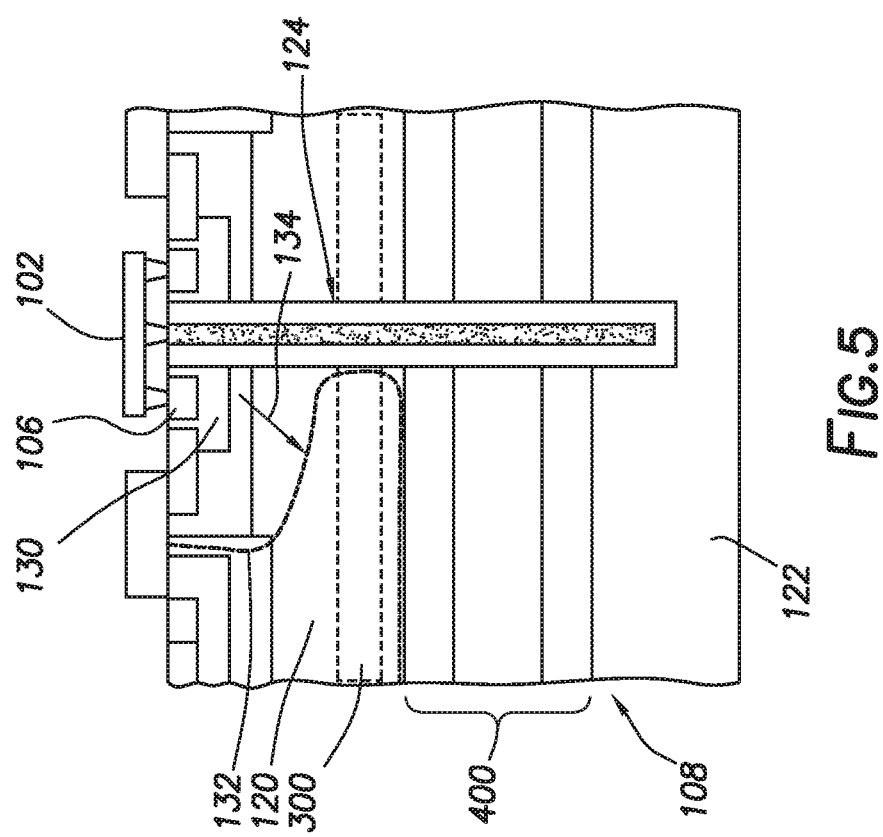
FIG. 5 illustrates an enlarged partial cross-sectional view of one embodiment of a semiconductor device having a connection between conductive material inside a trench isolation structure and a semiconductor device structure, with a floating buried layer, and with an anti-punch through layer for limiting a depletion region.

In certain embodiments as shown in FIG. 5, the semiconductor substrate 108 with the floating buried doped region 400 may also include the APT layer 300 described above. In such an embodiment, the depletion region 132 is contained on the underside by the floating buried doped region 400 and is contained toward the trench isolation structures 124 on the side. The connection 102, however, still increases the VBD of the semiconductor device 100 by increasing the depletion region 132 away from the drain region 130, as described above. Furthermore, as shown in FIG. 6, the semiconductor substrate 108 may include the floating buried doped region 400 and the BOX 200 described above.

Figure 7:
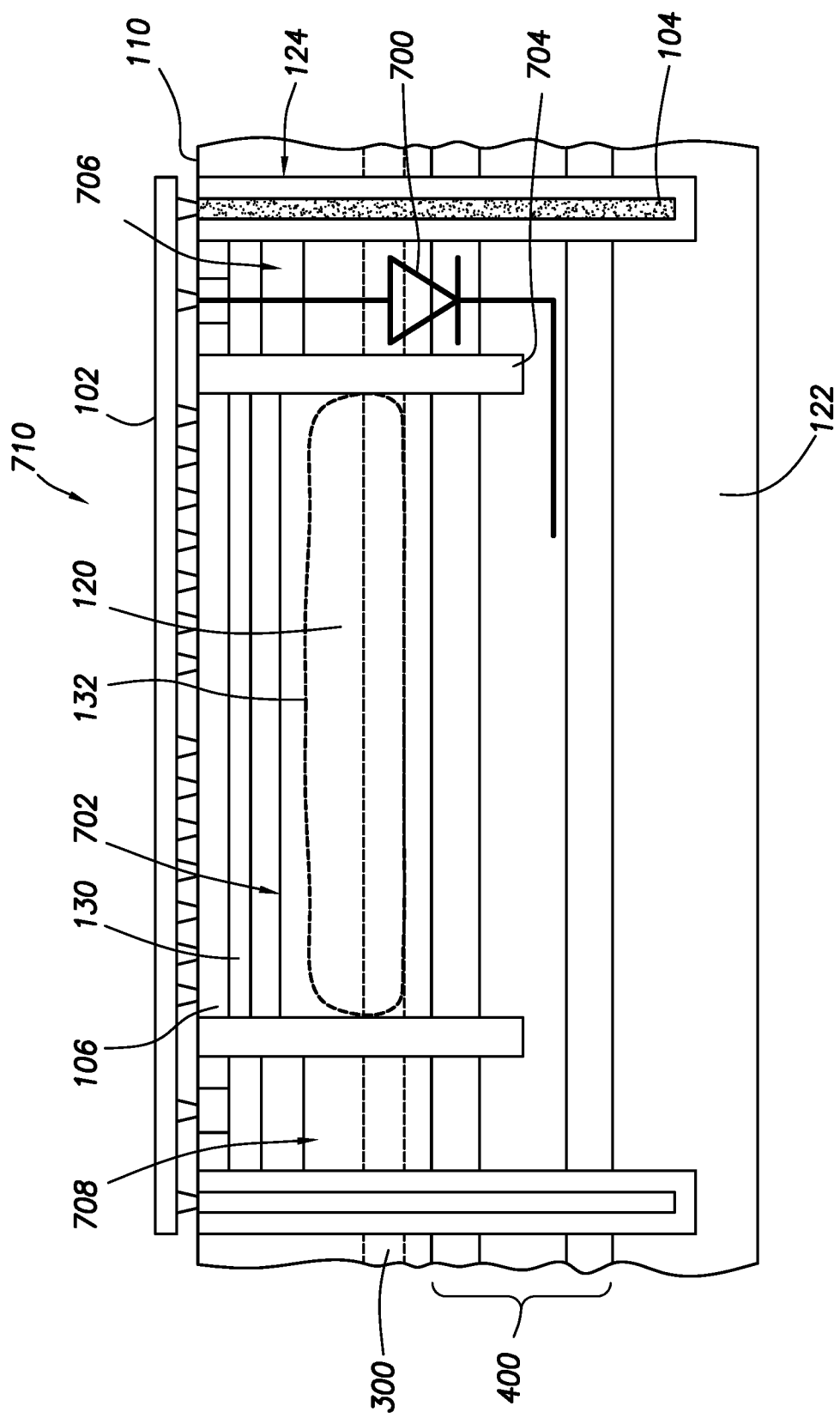
FIG. 7 illustrates an enlarged partial cross-sectional view of one embodiment of a semiconductor device at an orientation perpendicular to the orientations of FIGS. 1-6 and having a connection between conductive material inside a trench isolation structure and a semiconductor device structure, with a MTI side termination.

Certain embodiments of the semiconductor device 100 may also include a medium-depth trench isolation (MTI) side termination diode 700, as shown in FIG. 7. The diode 700 is insulated from a first portion 702 of an active region 710 of the semiconductor device 100 by an insulated trench structure 704 that extends from the first major surface 110 through the first doped region 120 and terminates within the floating buried doped region 400. The diode 700 indirectly accesses the floating buried doped region 400 through a second portion 706 of the active region 710 of the semiconductor device 100, creating vertical depletion from the bottom. Additionally or alternatively, a third portion 708 of the active region 710 may include an additional diode. The diode 700 may be used for spacing the drain edges from the DTI structure 124. Spacing the drain edges may be known as lateral termination. The insulated trench structure 704 is disposed within the perimeter of the trench isolation structure 124.

In the illustrated embodiment of FIG. 7, the first portion 702 of the active region 710 includes an active semiconductor device structure (not shown). The active semiconductor device structure is electrically connected to the conductive trench filling 104 of the trench isolation structure 124 by the connection structure 102. The connection structure 102 enables the conductive trench filling 104 to effect the depletion region as described above. The connection structure 102 may also connect (i.e., electrically couple) the second portion 706 and the third portion 708 of the active region 710.

In view of the above, it is evident that a novel device structure and method is disclosed. Included, among other features, is providing a connection between the conductive material inside trench isolation structures and a semiconductor device structure that is coupled to the drain region of a surface device. The connection increases the effectiveness of the depletion region by biasing the trench isolation structure. Putting a potential on the trench smooths the corner that is typically present in the depletion region, a corner which is causing a decrease in the VBD for a given $R_{ON}$.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A semiconductor device, comprising:
   a semiconductor substrate comprising:
   a first major surface;
   an opposing second major surface;
   a first doped region of a first conductivity type disposed beneath the first major surface; and
   a semiconductor region of the first conductivity type disposed between the first doped region and the opposing second major surface;
   a deep trench isolation structure comprising a conductive trench filling entirely enclosed on the side surfaces and bottom surface by an insulating trench liner, and extending from the first major surface through the first doped region and extending into the semiconductor region, wherein the deep trench isolation structure is configured to laterally isolate, both physically and electrically, an active region of the semiconductor device;
   a semiconductor device structure disposed with the first doped region, wherein the semiconductor device structure comprises a drain region comprising a drain structure; and
   a connection structure electrically coupling the conductive trench filling of the trench isolation structure with the drain region.

2. The device of claim 1, wherein the conductive trench filling and the connection structure comprise poly-silicon, metal, silicide, or any combinations thereof.

3. The device of claim 1, comprising an anti-punch through ("APT") layer, wherein the APT layer comprises a conductivity type that is the same as the first doped region, and an APT doping level that is different than a doping level of the first doped region, wherein the APT doping level prevents depletion of the first doped region.

4. The device of claim 1, comprising an insulating layer between the first doped region and the semiconductor region, wherein the trench isolation structure contacts the insulating layer.

5. The device of claim 1, comprising an insulated trench structure extending from the first major surface through the first doped region and terminating within the first doped region, wherein the insulated trench structure is disposed within the perimeter of the trench isolation structure, and the insulated trench structure defines a first portion and a second portion of an active region.

6. The device of claim 1, wherein the semiconductor substrate comprises a floating buried doped region of a second conductivity type that abuts the trench isolation structure.

7. The device of claim 6, comprising an anti-punch through ("APT") layer, wherein the APT layer comprises a conductivity type that is the same as the first doped region, and an APT doping level that is different than a doping level of the first doped region, wherein the APT doping level prevents depletion of the first doped region, and reduces the formation of an inversion channel to the floating buried doped region alongside the trench isolation structure.

8. The device of claim 6, comprising an insulating layer between the first doped region and the semiconductor region, wherein the trench isolation structure is in contact with the insulating layer.

9. The device of claim 1, wherein the drain region is the drain of a LDMOS device.

10. The device of claim 1, wherein the drain region is a cathode or an anode of a diode.

11. A semiconductor device, comprising:
    a semiconductor substrate comprising:
    a first major surface;
    an opposing second major surface
    a floating buried doped region of a first conductivity type;
    a first doped region of a second conductivity type disposed between the floating buried doped region and the first major surface; and
    a semiconductor region of the second conductivity type disposed between the floating buried doped region and the opposing second major surface;
    a trench isolation structure, comprising a conductive trench filling enclosed by an insulating trench liner, and extending from the first major surface through the first doped region, through the floating buried doped region, and into the semiconductor region, wherein:
    the floating buried doped region is abutting the trench isolation structure; and
    the trench isolation structure is a perimeter for an active region of the semiconductor device;
    an insulated trench structure extending from the first major surface through the first doped region and terminating within the floating buried doped region, wherein:
    the insulated trench structure is disposed within the perimeter of the trench isolation structure;
    a first portion, a second portion, and a third portion of the active region are electrically separated by the insulated trench structure; and
    the first portion, the second portion, and the third portion of the active region are electrically coupled to a common floating buried doped region;
    a first semiconductor device structure disposed within the first portion of the active region; and
    a connection structure electrically coupling at least a portion of the first semiconductor device structure with the conductive trench filling of the trench isolation structure.

12. The device of claim 11, wherein the trench isolation structure and the connection structure comprise poly-silicon, metal, silicide, or any combinations thereof.

13. The device of claim 11, comprising an APT layer, wherein the APT layer comprises an APT doping level of the second conductivity type, and the APT doping level is different than a doping level of the first doped region, wherein the APT doping level prevents depletion of the first doped region.

14. The device of claim 11, comprising an insulating layer between the floating buried doped region and the semiconductor region, wherein the trench isolation structure is in contact with the insulating layer.

15. The device of claim 11, wherein the second portion of the active region and the third portion of the active region are electrically coupled to the conductive trench filling of the trench isolation structure.

16. The device of claim 15, wherein at least a portion of the insulated trench structure is terminated within the floating buried doped region.

* * * * *